(12) United States Patent
Cheng

(10) Patent No.: US 10,726,719 B1
(45) Date of Patent: Jul. 28, 2020

(54) PIEZOELECTRIC POWER GENERATION FOR ROADWAYS

(71) Applicant: INTERNATIONAL BUSINESS MACHINES CORPORATION, Armonk, NY (US)

(72) Inventor: Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/268,090

(22) Filed: Feb. 5, 2019

(51) Int. Cl.
| | |
|---|---|
| *G08G 1/07* | (2006.01) |
| *G08G 1/01* | (2006.01) |
| *E01C 9/00* | (2006.01) |
| *E01F 9/559* | (2016.01) |
| *E01C 11/00* | (2006.01) |
| *H02N 2/18* | (2006.01) |
| *H01L 41/08* | (2006.01) |
| *H01L 41/193* | (2006.01) |
| *H01L 41/113* | (2006.01) |
| *E01F 11/00* | (2006.01) |

(52) U.S. Cl.
CPC .............. *G08G 1/07* (2013.01); *E01C 9/00* (2013.01); *E01C 11/00* (2013.01); *E01F 9/559* (2016.02); *E01F 11/00* (2013.01); *G08G 1/01* (2013.01); *H01L 41/082* (2013.01); *H01L 41/1138* (2013.01); *H01L 41/193* (2013.01); *H02N 2/181* (2013.01); *H02N 2/183* (2013.01); *E01C 2201/00* (2013.01)

(58) Field of Classification Search
CPC ... G08G 1/07; G08G 1/01; E01F 9/559; E01F 11/00; E01C 9/00; E01C 11/00; E01C 2201/00; H01L 41/082; H01L 41/1138; H01L 41/193; H02N 2/181; H02N 2/183
USPC .......................................................... 340/917
See application file for complete search history.

(56) References Cited

U.S. PATENT DOCUMENTS

| | | | |
|---|---|---|---|
| 6,420,945 B1 * | 7/2002 | Yamamoto | H03H 9/605 333/189 |
| 8,278,800 B2 | 10/2012 | Abramovich et al. | |
| 8,761,991 B1 * | 6/2014 | Ferguson | G05D 1/0088 340/917 |
| 9,837,600 B2 * | 12/2017 | Daniel | H02N 2/18 |

(Continued)

FOREIGN PATENT DOCUMENTS

EP  2252740  11/2010

OTHER PUBLICATIONS

S. Egusa et al., "Multimaterial piezoelectric fibres", Nature Materials, Aug. 2010.

(Continued)

*Primary Examiner* — Kerri L McNally
*Assistant Examiner* — Thang D Tran
(74) *Attorney, Agent, or Firm* — Tutunjian & Bitetto, P.C.; L. Jeffrey Kelly

(57) ABSTRACT

Road signal systems and methods for controlling road signals include a piezoelectric layer integrated with a surface that undergoes stresses with traffic passing over the surface. A power collection circuit is configured to collect and store power from the piezoelectric layer. One or more devices receive electrical power from the power collection circuit responsive to traffic passing over the surface.

20 Claims, 7 Drawing Sheets

(56) References Cited

U.S. PATENT DOCUMENTS

| | | | |
|---|---|---|---|
| 2002/0106311 A1* | 8/2002 | Golbig | B01F 5/0604 422/130 |
| 2004/0040132 A1* | 3/2004 | Wilkie | H01L 41/082 29/25.35 |
| 2004/0230090 A1* | 11/2004 | Hegde | A61B 5/0215 600/18 |
| 2005/0231121 A1* | 10/2005 | Molvidson | G09F 13/16 315/86 |
| 2005/0269914 A1* | 12/2005 | Berlemont | H01L 41/083 310/366 |
| 2007/0223996 A1* | 9/2007 | Green | G08G 1/095 404/9 |
| 2008/0119780 A1* | 5/2008 | Wang | A61B 17/2202 604/22 |
| 2010/0045111 A1* | 2/2010 | Abramovich | E01B 3/00 307/43 |
| 2010/0148519 A1* | 6/2010 | Shih | H01L 41/1136 290/1 R |
| 2010/0231046 A1* | 9/2010 | Doraisamy | H01L 35/30 307/48 |
| 2011/0125029 A1* | 5/2011 | Wang | A61B 5/0068 600/476 |
| 2012/0212375 A1* | 8/2012 | Depree, IV | B82Y 10/00 343/700 MS |
| 2012/0298165 A1* | 11/2012 | Kurihara | H01L 35/32 136/230 |
| 2013/0135118 A1* | 5/2013 | Ricci | H04W 4/90 340/932.2 |
| 2013/0154441 A1* | 6/2013 | Redmond | G08G 1/02 310/319 |
| 2013/0293068 A1* | 11/2013 | Nishida | H02N 2/18 310/339 |
| 2014/0007687 A1* | 1/2014 | Wang | H01L 41/0805 73/584 |
| 2014/0300250 A1* | 10/2014 | Marin Ramirez | H02N 2/18 310/319 |
| 2014/0368087 A1* | 12/2014 | Hiraoka | G02B 26/0858 310/345 |
| 2015/0187347 A1* | 7/2015 | Kojima | G01S 15/8915 310/322 |
| 2016/0076207 A1* | 3/2016 | Moran | E01F 9/30 340/905 |
| 2016/0205325 A1* | 7/2016 | Kawai | G02B 7/02 348/208.11 |
| 2016/0218643 A1* | 7/2016 | Abu Al-Rubb | H02N 2/18 |
| 2017/0047865 A1* | 2/2017 | Karami | H02N 2/18 |
| 2017/0258585 A1* | 9/2017 | Marquez | A61F 2/2409 |

OTHER PUBLICATIONS

Hang-Beom Eom et al., "Thin-fi lm piezoelectric MEMS", MRS Bulletin • vol. 37 • Nov. 2012 • www.mrs.org/bulletin.

E. Nilsson et al., "Energy harvesting from piezoelectric textile fibers", Procedia Engineering, Dec. 2014.

* cited by examiner

PIEZOELECTRIC POWER GENERATION FOR ROADWAYS

BACKGROUND

Technical Field

The present invention generally relates to piezoelectric energy generation and, more particularly, to the generation of electrical energy at roadways for use in roadside signals and other devices.

Description of the Related Art

The proliferation of connected devices, which can be used for a wide variety of purpose and include Internet of Things (IoT) devices as well as simpler powered devices, necessitates a large amount of electrical power. Furthermore, because of the distributed nature of these devices, it can be difficult to reliably provide consistent electrical power. Particularly in rural areas, where electrical infrastructure may not be as pervasive as in urban areas, devices may need to generate power locally or run off of battery power.

SUMMARY

A road signal system includes a piezoelectric layer integrated with a surface that undergoes stresses with traffic passing over the surface. A power collection circuit is configured to collect and store power from the piezoelectric layer. One or more devices receive electrical power from the power collection circuit responsive to traffic passing over the surface.

A road signal system includes a piezoelectric layer formed from a plurality of piezoelectric tiles under a road surface that undergoes stresses with vehicle traffic passing over the surface. Each piezoelectric tile has one or more piezoelectric fibers that include a conductive portion and a piezoelectric portion. A power collection circuit is configured to collect and store power from the piezoelectric layer. One or more devices receive electrical power from the power collection circuit responsive to traffic passing over the surface. A roadside device control system is configured to detect an approaching vehicle and to activate the one or more devices responsive to detecting the approaching vehicle.

A method for controlling road signals includes collecting power from a piezoelectric layer integrated with a surface that undergoes stresses with traffic passing over the surface. One or more devices that receive electrical power from the piezoelectric layer are activated responsive to traffic passing over the surface.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention integrate piezoelectric materials with roadways to convert the mechanical energy of passing vehicles, which deform the surface they drive on, into electrical energy that can be used locally to power roadside devices. It is particularly contemplated that illuminated roadside markers can be used to help guide automated vehicles, which use sensors to detect the boundaries of the roadway, but which have difficulty determining those boundaries when inclement weather obscures road markings.

The piezoelectric effect is present in certain materials that exert an electric field when the material is deformed. Conversely, applying an electric field to a piezoelectric material causes the material to deform. The present embodiments specifically contemplate the use of piezoelectric fibers that are integrated with the roadway, but it should be understood that other piezoelectric structures can be used instead.

Although the present embodiments are described with particular focus on the use of piezoelectric materials in roadways, it should be understood that the present principles can be applied in any appropriate surface, such as sidewalks, staircases, and any other surface that absorbs and dissipates stresses.

Figure 1:
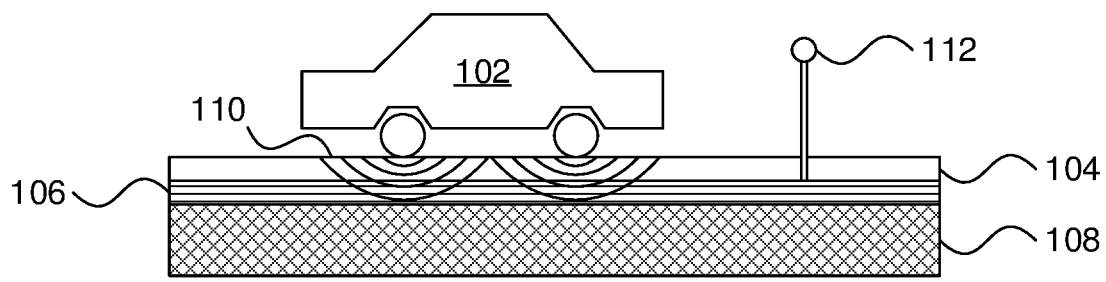
FIG. 1 is a diagram of a vehicle moving on a surface with a piezoelectric layer that powers a roadside device in accordance with an embodiment of the present invention.

Referring now to FIG. 1, a diagram of a vehicle 102 moving on a road surface 104 in accordance with the present embodiments is shown. The road includes road surface layer 104, a piezoelectric layer 106, and an underlying base layer 108. It should be understood that any appropriate road surfacing material can be used for the road surface layer 104, including, for example, asphalt, concrete, cobblestone, composite pavements, pavers, polymer surfacing materials, permeable surfacing materials, etc. The base layer 108 can be formed from any appropriate road-building material. In some embodiments, it is contemplated that the base layer 108 can be formed from a top layer of asphalt, with a base course, subbase, and subgrade underneath.

As noted above, it is specifically contemplated that the piezoelectric layer 106 can be formed from piezoelectric fibers. In some embodiments, such fibers can be formed in a manner similar to the formation of optical fibers, where layers of a piezoelectric material such as, e.g., poly(vinylidene fluoride) (PVDF), are layered with, e.g., polycarbonate sheathing layers, metal conductors, carbon-loaded polycarbonate layers and then drawn thin to form a fiber that produces a voltage through its conductor when deformed. It should be understood that other embodiments may employ other piezoelectric materials in other shapes. For example, in some embodiments a layer of vertical piezoelectric fibers can be formed between two electrode layers. Such an embodiment can be rolled to form multiple layers that multiply the amount of power generated, without complicating power collection. For example, piezoelectric strips or plates can be used instead of fibers. As will be described in more detail below, the fibers can be connected to power collection circuitry to harvest electrical currents.

As the vehicle 102 passes over the road surface 104, the weight of the vehicle 102 causes the road surface 104 to deform, creating stresses 110 in the road surface 104 which are transferred to the piezoelectric layer 106. The piezoelectric layer 106 deforms under the stresses 110, causing the piezoelectric material to exert a local electric field. The local electric field causes a current to flow within a conductor of the piezoelectric layer 106. The current is harvested and is used to power one or more roadside devices 112.

Although the roadside devices 112 are shown as being provided in the form of signposts, it should be understood that these devices can be implemented as any form of powered device and can be positioned at any location with respect to the road. In some particularly contemplated embodiments, the roadside devices 112 can take the form of an illuminated sign or signal, for example using light emitting diodes (LEDs) to provide an indication about road boundaries or a road condition. In other embodiments, the roadside devices 112 can take the form of a non-optical transmitter, for example operating on radio frequencies, to provide information to passing vehicles. In some embodiments, the roadside devices 112 can be powered directly by the piezoelectric layer 106, without any power collection circuitry.

In one specifically contemplated embodiment, the roadside devices 112 can include networking hardware that enables the roadside devices 112 to have two-way communication with vehicles 102 and with other nearby roadside devices 112. In this way, a locally powered mesh network can be formed that can provide data communications between the vehicle 102 and the internet, providing real-time information such as traffic and weather conditions and reporting back such information from sensors in the vehicle 102.

In some embodiments the roadside devices 112 can be integrated with the road surface 102, for example being embedded in the surface material, with or without a portion of the roadside devices 112 being visible to vehicles 102. Such embedded roadside devices 112 can monitor conditions of the road, for example detecting deterioration of the road surface 102 through the use of fibers or wires in the road surface 102 and a sensing mechanism, such as time-domain reflectometry, to detect when the fibers are damaged or broken. Such embedded roadside devices 112 can then communicate road condition information to other roadside devices 112 or to a cellphone tower or other networked communication system to provide an alert to road maintenance workers.

The roadside devices 112 can be connected to the piezoelectric layer 106 in any appropriate fashion. In some embodiments, the roadside devices 112 may be connected directly to the piezoelectric layer 106 and use electrical power generated by the piezoelectric layer 106 directly. In other embodiments, some form of power collection circuitry may be imposed between the piezoelectric layer 106 and the roadside devices to provide rectification and storage.

Figure 2:
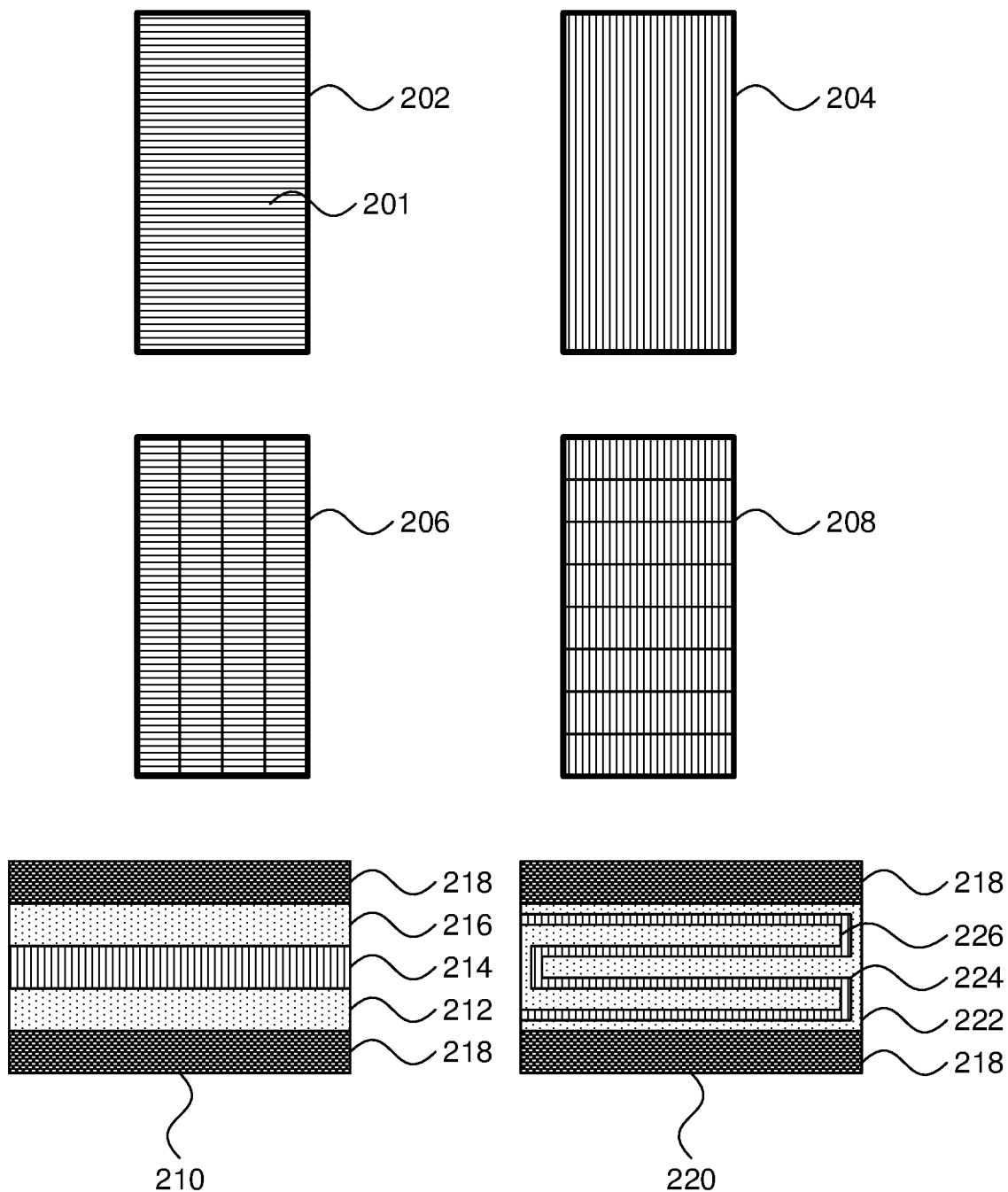
FIG. 2 is a diagram showing different embodiments of a piezoelectric layer that can power a roadside device in accordance with an embodiment of the present invention.

Referring now to FIG. 2, different configurations of the piezoelectric layer 106 are shown. In a first embodiment 202, the piezoelectric layer 106 is shown from a top-down perspective, with dimensions being generally dictated by the size and shape of the road surface 102. A set of piezoelectric fibers 201 is provided in an orientation that is perpendicular to a long dimension of the road surface 102. In this first embodiment 202, power can be collected from the piezoelectric fibers 106 at the sides of the road or can be collected by devices that are embedded in the road surface 102.

In a second embodiment 204, the piezoelectric layer 106 is shown from a top-down perspective, with dimensions being generally dictated by the size and shape of the road surface 102. The piezoelectric fibers 201 can be oriented in a direction that is parallel to the long dimension of the road surface 102. In this second embodiment 204, power can be collected from the piezoelectric fibers 106 by devices that are embedded in the road surface 102.

In a third embodiment 206, the piezoelectric layer 106 is shown from a top-down perspective, with dimensions being generally dictated by the size and shape of the road surface 102. The piezoelectric fibers 201 can be oriented in a direction that is perpendicular to the long dimension of the road surface 102, but have lengths that are shorter than the full width of the road surface. In this third embodiment 206, power can be collected from the piezoelectric fibers 106 using power collection circuitry that is part of the piezoelectric layer 106 or that is embedded in the road surface 102 or by devices that are at the sides of the road surface 102 or that are embedded in the road surface. The use of shorter sections of piezoelectric fiber 201 makes the system more robust against damage, as any damage to the piezoelectric layer 106 can be localized. Additionally, damaged sections can be replaced or repaired without digging up a large part of the road surface 102.

In a fourth embodiment 208, the piezoelectric layer 106 is shown from a top-down perspective, with dimensions being generally dictated by the size and shape of the road surface 102. The piezoelectric fibers 201 can be oriented in a direction that is perpendicular to the long dimension of the road surface 102, but have lengths that are shorter than the full width of the road surface. In this fourth embodiment 208, power can be collected from the piezoelectric fibers 106 using power collection circuitry that is part of the piezoelectric layer 106 or that is embedded in the road surface 102 or by devices that are embedded in the road surface. As above, the use of shorter sections of piezoelectric fiber 201 makes the system more robust against damage.

In a fifth embodiment 210, the piezoelectric layer 106 is shown in cross-section. A first electrode 212, a piezoelectric material 214, and a second electrode 216 are sandwiched between two layers of a road material 218, such as asphalt. In this fifth embodiment 210, a polarization of the piezoelectric material 214 can be any appropriate direction, but it is specifically contemplated as being directed up or down.

In a sixth embodiment 220, the piezoelectric layer 106 is shown in cross-section. A first electrode 222, a piezoelectric material 224, and a second electrode 226 are rolled to provide multiple vertical layers of piezoelectric material 214 what are all electrically continuous. This creates the equivalent of multiple piezoelectric cells in parallel, sharing electrodes. Any number of such rolls can be used to create an arbitrary number of vertically arranged piezoelectric cells. In the fifth and sixth embodiments, only a single output wiring is needed for each electrode.

It should be understood that other embodiments beyond those described above are also contemplated. For example, the piezoelectric fibers 201 can be oriented in a direction that is diagonal with respect to the long dimension of the road surface. In other embodiments, the piezoelectric fibers 201 can be formed under a curved road surface, for example following the curve's path or being positioned radially. In addition, the road surface 102 need not be flat, but may instead follow the contours of the underling ground 108, with the piezoelectric fibers 201 conforming to the shape of the road surface 102. It should be understood that the piezoelectric fibers 201 can be embedded in the material of the road surface 102 or can be formed on a separate layer above or below the road surface 102 to form the piezoelectric layer 106.

Figure 3:
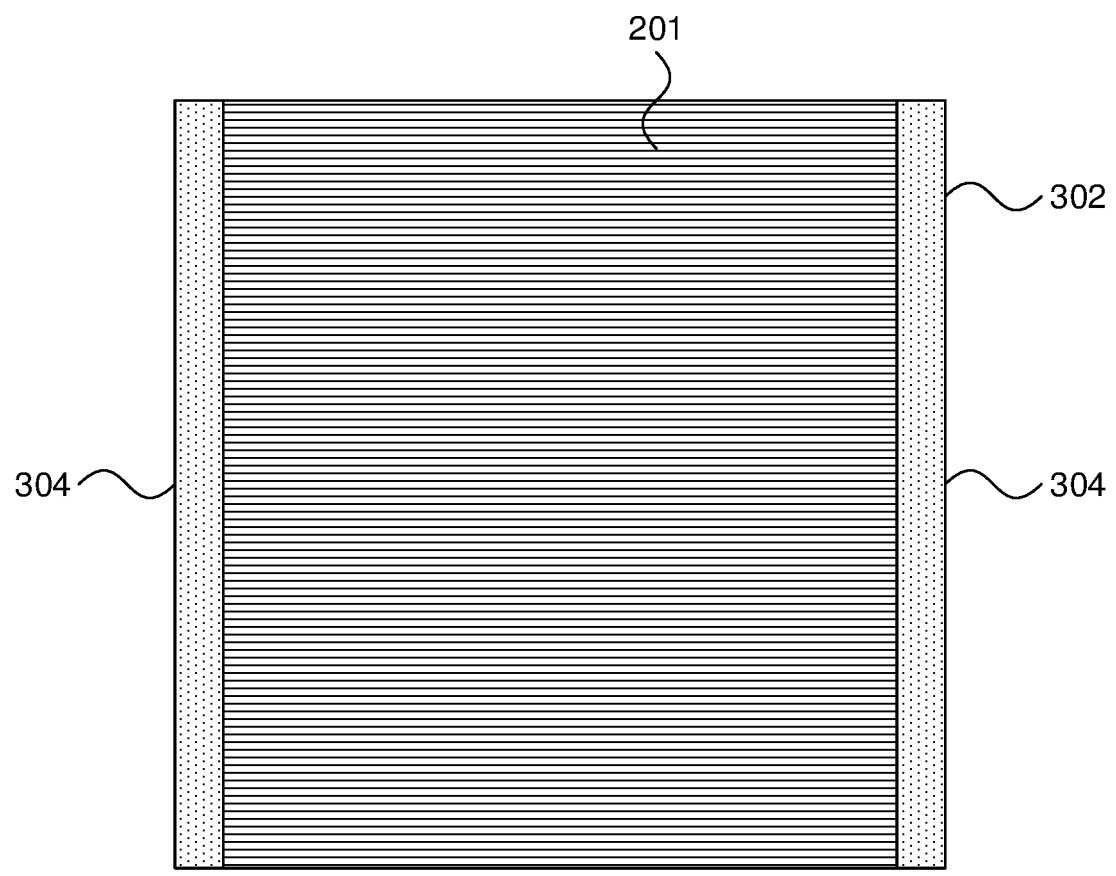
FIG. 3 is a top-down diagram of a tile of piezoelectric material with power collection circuitry in accordance with an embodiment of the present invention.

Referring now to FIG. 3, a piezoelectric tile 302 is shown. In some embodiments, the piezoelectric layer 106 can be formed as a set of tiles that include a set of piezoelectric fibers 201 formed on a substrate. In some embodiments, it is contemplated that the substrate may be formed from a durable, flexible material that allows stresses in an overlying road surface 102 to be transmitted to the piezoelectric material. It should be understood that, although the piezoelectric tile 302 is shown from a top-down perspective as being representative of the third embodiment 206 or fourth embodiment 208, as described above, the first embodiment 202, second embodiment 204, fifth embodiment 210, and sixth embodiment 220 can be formed according to a similar structure.

Forming the piezoelectric layer 106 from tiles 302 makes it possible to replace local damaged sections without having to disrupt large portions of the road surface 102. Power collection circuitry 304 is used to collect, store, and redirect power from the fiber piezoelectric material. The power collection circuitry 304 from one tile 302 can connect to the power collection circuitry 304 of another tile 302 to provide a power distribution network.

It should be noted that the amount of power that is generated is proportional to the density of the piezoelectric fibers 201. The stresses caused by a vehicle 102 cause minor deformations in the road surface 102, and each piezoelectric fiber 201 that follows this deformation will provide its own electrical currents. Thus, as more fibers 201 are added, the power generated increases. Similarly, the amount of power that is generated scales with the number of layers or rolls in the piezoelectric material. Tiles can be packed side-by-side as well as vertically to form a thick layer of fibers, with the thickness being limited by the mechanical requirements of the road.

Figure 4:
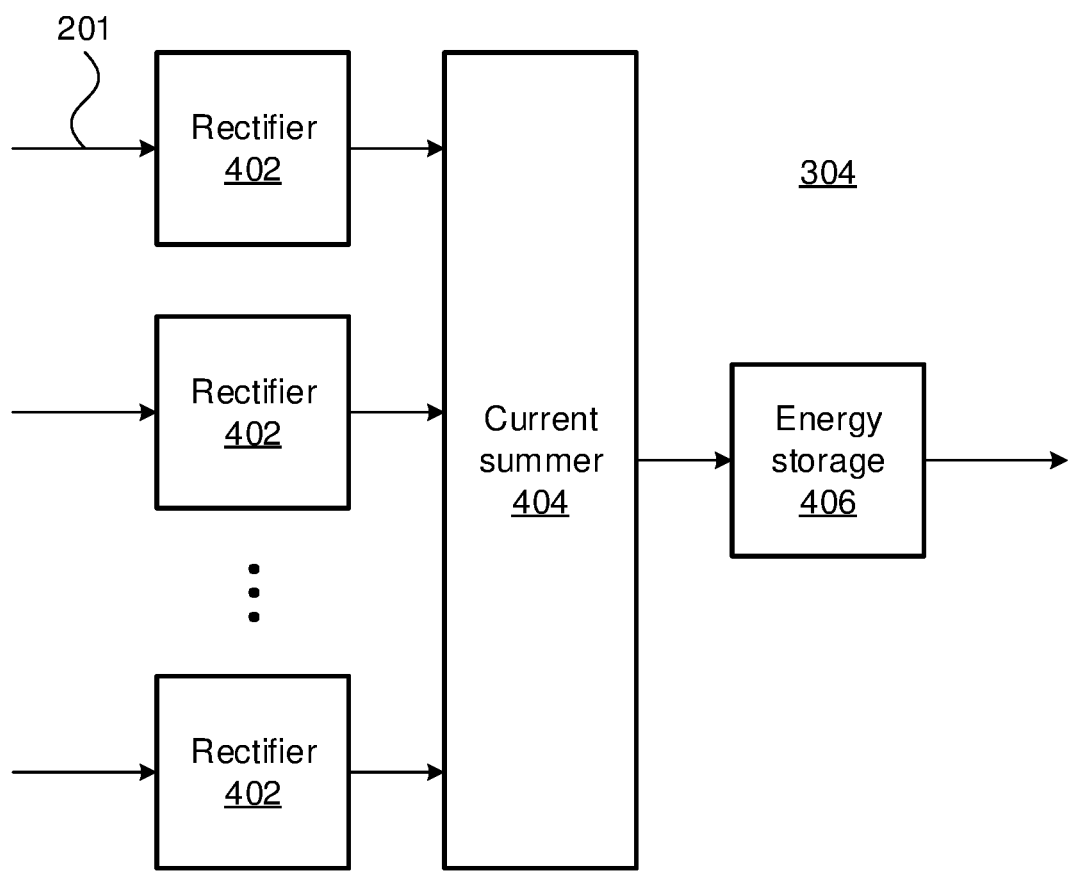
FIG. 4 is a block diagram of power collection circuitry that is configured to collect electrical power from multiple regions of a piezoelectric layer in accordance with an embodiment of the present invention.

Referring now to FIG. 4, a block diagram of power collection circuitry 304 is shown. A set of piezoelectric fibers 201 provide an input to the power collection circuitry 304. Because the direction of current generated by a piezoelectric fiber 201 will depend on the particular direction of stresses in the piezoelectric material of the fiber 201, currents can be generated in either direction. As such, each piezoelectric fiber's output is first rectified by a rectifier 402 before being combined by current summer 404. The outputs are rectified before being summed to prevent incoming and outgoing currents from cancelling one another out. It should be understood that certain roadside devices 112, such as incandescent lights, do not need rectification to work. Other roadside devices 112 may include built-in rectification, such that no additional rectification in the power collection circuitry 304 is needed. It should also be understood that, although the power collection circuitry 304 is shown as being part of an embodiment that uses piezoelectric tiles 302, the power collection circuitry 304 can be employed in any appropriate embodiment.

The current summer 404 combines the rectified currents by any appropriate circuitry and then outputs a single current to an energy storage device 406. The energy storage device 406 stores a charge and can be formed from, e.g., a battery, a capacitor, mechanical energy storage such as a flywheel, or any other appropriate form of energy storage. The electrical energy stored by the energy storage 406 outputs current to roadside devices 112 as needed. In some embodiments, the output of the energy storage 406 is provided to a power distribution network between the tiles 304 before reaching a roadside device 112. Although the power collection circuitry 304 is described above in the context of a tile of horizontally oriented piezoelectric fibers 106, it should be understood that similar power collection circuitry can be provided for any arrangement of piezoelectric fibers 106 or any other piezoelectric material.

Figure 5:
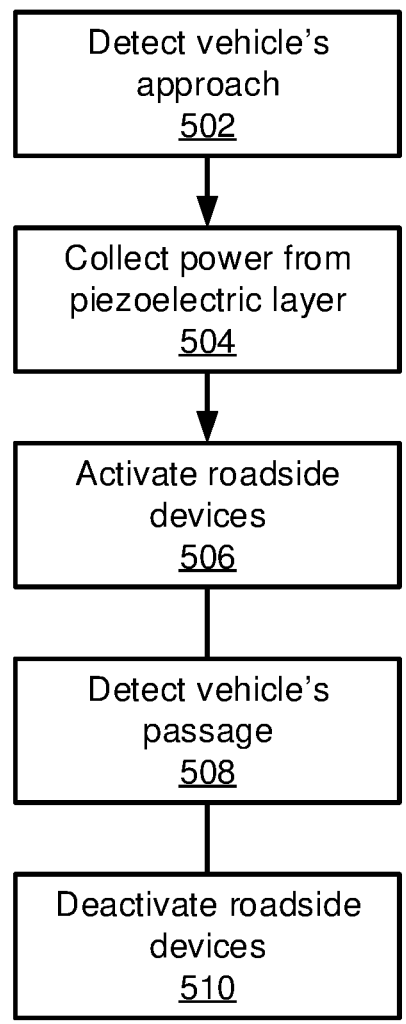
FIG. 5 is a block/flow diagram of a method for controlling roadside devices using power collected from a piezoelectric layer in accordance with an embodiment of the present invention.

Referring now to FIG. 5, a method for operating roadside devices 112 using power generated by the piezoelectric layer 106 is shown. Block 502 detects the approach of a vehicle 102. This detection can be performed by detecting the presence of current being generated by the piezoelectric layer 106 or can be performed by any appropriate sensor or set of sensors. In some embodiments, detection of the vehicle 102 can be performed by a device earlier along the road and can be communicated ahead to controllers in subsequent road sections.

Block 504 collects power from the piezoelectric layer 106, for example by using power collection circuitry 304 described above. It should be understood that, because energy storage 406 in the power collection circuitry 304 stores electrical energy from one vehicle to the next, the collection of power from piezoelectric layer 504 can be performed continuously and can include energy collected from the passage of vehicles previous to the detection of a current vehicle in block 502.

Block 506 then uses the power collected by block 504 to activate one or more roadside devices 112. In some embodiments, such as in the case of LED signals, this activation can include providing an electrical current to the roadside devices 112. In other embodiments, such as when graphical or textual information is displayed at a roadside sign, the activation can include transmitting information to the roadside devices 112 for display.

The present embodiments can thereby use local roadside devices 112 to adaptively respond to traffic conditions. For example, in a rural area where the traffic density is low, there may not be sufficient traffic to power the roadside devices 112 continuously. The present embodiments therefore provide advance warning of the approach of a vehicle and activate the roadside devices 112 for only as long as they are actually needed. Block 508 thus detects the passage of the vehicle 102 and block 510 deactivates the roadside devices 112.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 6:
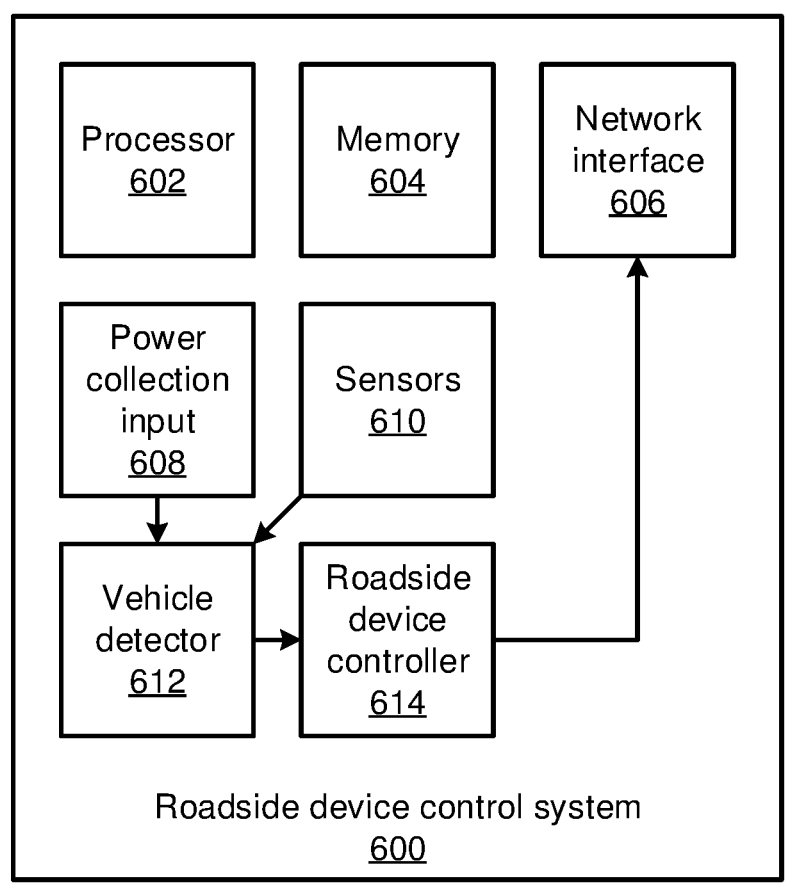
FIG. 6 is a block diagram of a roadside device control system that controls roadside devices using power collected from a piezoelectric layer in accordance with an embodiment of the present invention.

Referring now to FIG. 6, a roadside device control system 600 is shown. It should be understood that the roadside device control system 600 can be a standalone device that is self-powered or that draws power from the piezoelectric layer 106. In other embodiments, the roadside device control system 600 can be integrated with roadside devices 112. The system 600 includes a hardware processor 602 and memory 604. A network interface 606 provides communications between the roadside device control system 600 and one or more roadside device 112. The network interface 606 operates according to any appropriate wired or wireless communications medium and protocol. The roadside device control system 600 may also include one or more functional modules or components. Each such module or component can be implemented as software that is stored in memory 604 and that is executed by hardware processor 602. In other embodiments, one or more of the functional modules or components can be implemented as one or more discrete hardware components in the form of application-specific integrated chips or field-programmable gate arrays.

A power collection input 608 collects electrical currents from the power collection circuitry 304 or from the piezoelectric fibers 201 directly. This power input can serve a dual role of powering the roadside device control system 600 and providing information regarding whether a vehicle 102 is approaching, present, or departed. One or more sensors 610 provide further information regarding vehicles on the road and other road conditions. The sensors 610 can be integrated with the roadside device control system 600, as shown, or one or more of the sensors 610 can be implemented as separate devices that communicate with the roadside device control system 600 using the network interface 606.

A vehicle detector 612 accepts the information provided by the power collection input 608 and the sensors 610 to determine whether a vehicle 102 is approaching or has departed. Based on this vehicle position information, roadside device controller 614 determines whether to activate one or more roadside devices 112. The roadside device controller 614 then communicates with the one or more roadside devices 112 using the network interface 606 to activate or deactivate the device(s) 112.

Figure 7:
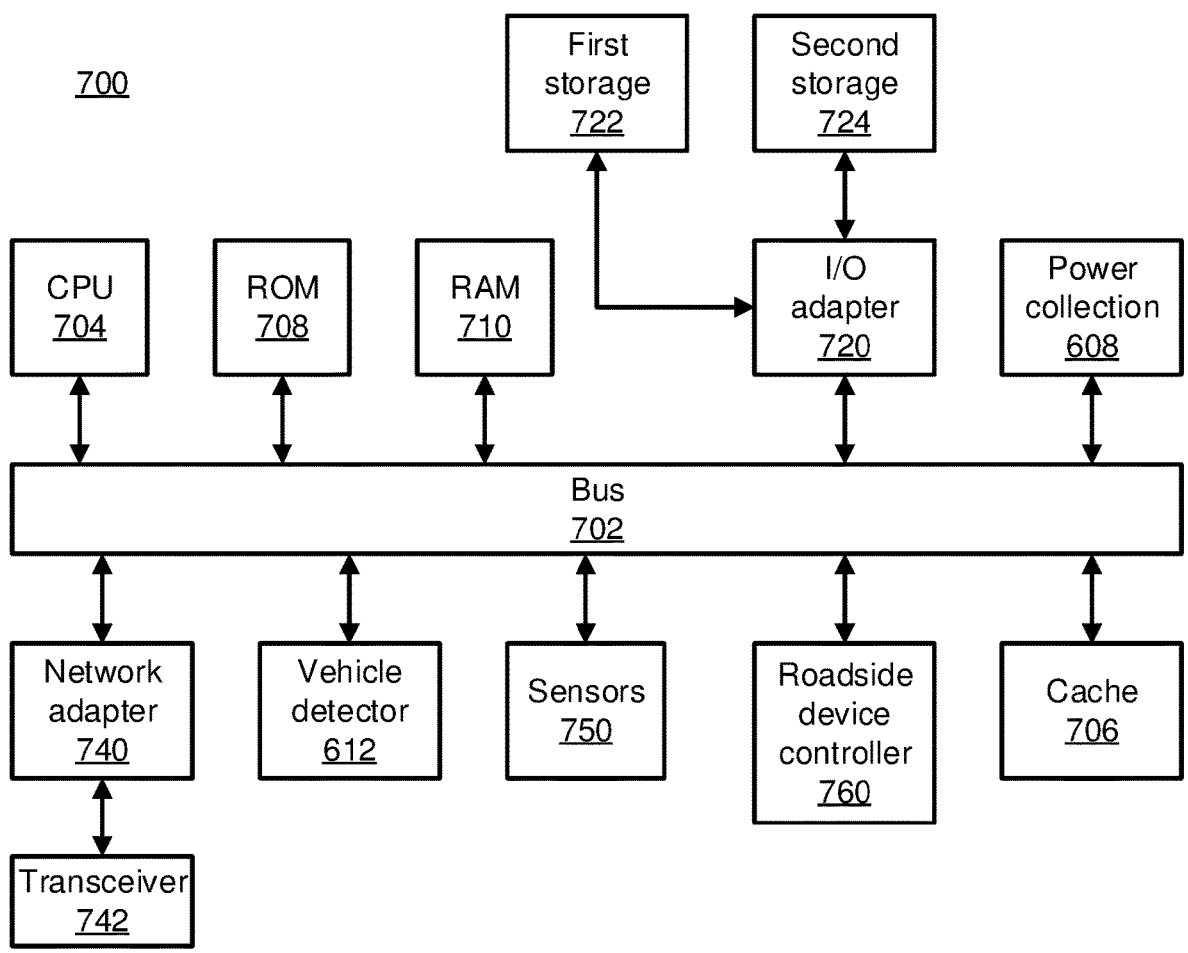
FIG. 7 is a processing system in accordance with an embodiment of the present invention.

Referring now to FIG. 7, an exemplary processing system 700 is shown which may represent the transmitting device 100 or the receiving device 120. The processing system 700 includes at least one processor (CPU) 704 operatively coupled to other components via a system bus 702. A cache 706, a Read Only Memory (ROM) 708, a Random Access Memory (RAM) 710, an input/output (I/O) adapter 720, a sound adapter 730, a network adapter 740, a user interface adapter 750, and a display adapter 760, are operatively coupled to the system bus 702.

A first storage device 722 and a second storage device 724 are operatively coupled to system bus 702 by the I/O adapter 720. The storage devices 722 and 724 can be any of a disk storage device (e.g., a magnetic or optical disk storage device), a solid state magnetic device, and so forth. The storage devices 722 and 724 can be the same type of storage device or different types of storage devices.

A transceiver 742 is operatively coupled to system bus 702 by network adapter 740. Power collection circuitry 608 collects electrical power from a piezoelectric layer and, in concert with sensors 750, provides a basis for vehicle detector 612 to detect the coming and going of passing vehicles. Roadside device controller 760 uses the network adapter 740 to issue commands to roadside devices 112.

Of course, the processing system 700 may also include other elements (not shown), as readily contemplated by one of skill in the art, as well as omit certain elements. For example, various other input devices and/or output devices can be included in processing system 700, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 700 are readily contemplated by one of ordinary skill in the art given the teachings of the present principles provided herein.

Having described preferred embodiments of piezoelectric power generation for roadways (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A road signal system, comprising:
a piezoelectric layer, integrated with a surface that undergoes stresses with traffic passing over the surface, that includes one or more folds, such that multiple layers of piezoelectric material are vertically stacked and have a shared electrical power output;
a power collection circuit configured to collect and store power from the piezoelectric layer; and
one or more devices that receive electrical power from the power collection circuit responsive to traffic passing over the surface.

2. The road signal system f claim 1; wherein the piezoelectric layer is positioned below a road surface that undergoes stressing from passing vehicles.

3. The road signal system of claim 1, wherein the piezoelectric layer includes one or more piezoelectric fibers that include a conductive portion and a piezoelectric portion.

4. The road signal system of claim 3, wherein the piezoelectric layer is formed from a plurality of piezoelectric tiles arranged side-by-side and in electrical communication with one another, each comprising a set of piezoelectric fibers that are confined to the respective piezoelectric tile and that are in electrical communication with the power collection circuit.

5. The road signal system of claim 1, wherein the one or more devices comprises a signal device that provides information to automated vehicles.

6. The road signal system of claim 5, wherein the signal device is a light-emitting device powered by the received electrical power.

7. The road signal system of claim 1, further comprising a roadside device control system configured to detect an approaching vehicle and to activate the one or more devices responsive to detecting the approaching vehicle.

8. The road signal system of claim 7, wherein the roadside device control system is further configured to detect the approaching vehicle by detecting a current generated by the piezoelectric layer.

9. The road signal system of claim 7, wherein the one or more devices activated by the roadside device control system are located ahead of the approaching vehicle.

10. The road signal system of claim 1, wherein the one or more folds bend the piezoelectric layer over itself.

11. A road signal system, comprising:
a piezoelectric layer formed from a plurality of piezoelectric tiles, arranged side-by-side and in electrical communication with one another, under a road surface that undergoes stresses with vehicle traffic passing over the surface, each piezoelectric tile having one or more piezoelectric fibers that include a conductive portion and a piezoelectric portion;
a power collection circuit configured to collect and store power from the piezoelectric layer;
one or more devices that receive electrical power from the power collection circuit responsive to traffic passing over the surface; and
a roadside device control system configured to detect an approaching vehicle and to activate the one or more devices responsive to detecting the approaching vehicle.

12. A method for controlling road signals, comprising:
collecting power from a piezoelectric layer, formed from a plurality of tiles arranged side-by-side and in electrical communication with one another, integrated with a surface that undergoes stresses with traffic passing over the surface by collecting the Dower through a power distribution network formed by the plurality of tiles; and
activating one or more devices that receive electrical power from the piezoelectric layer responsive to traffic passing over the surface.

13. The road signal system of claim 12, wherein the piezoelectric layer is positioned below a road surface that undergoes stressing from passing vehicles.

14. The road signal system of claim 2, wherein the piezoelectric layer includes one or more piezoelectric fibers that include a conductive portion and a piezoelectric portion.

15. The road signal system of claim 14, wherein collecting power from the piezoelectric layer comprises rectifying and summing currents generated by respective piezoelectric fibers.

16. The road signal system of claim 12, wherein the one or more devices comprises a signal device that provides information to automated vehicles.

17. The road signal system of claim 16, activating the signal device comprises supplying electrical power to a light-emitting device.

18. The road signal system of claim 12, further comprising detecting an approaching vehicle and activating the one or more devices responsive to detecting the approaching vehicle.

19. The road signal system of claim 18, detecting the approaching vehicle includes detecting a current generated by the piezoelectric layer.

20. The road signal system of claim 18, wherein the one or more devices activated by the roadside device control system are located ahead of the approaching vehicle.

* * * * *